(12) United States Patent
Tanaka et al.

(10) Patent No.: US 11,222,740 B2
(45) Date of Patent: Jan. 11, 2022

(54) SUPERCONDUCTING MAGNET

(71) Applicant: Mitsubishi Electric Corporation, Tokyo (JP)

(72) Inventors: Tomonori Tanaka, Tokyo (JP); Taisaku Gomyo, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 17/051,545

(22) PCT Filed: May 31, 2018

(86) PCT No.: PCT/JP2018/020931
§ 371 (c)(1),
(2) Date: Oct. 29, 2020

(87) PCT Pub. No.: WO2019/229923
PCT Pub. Date: Dec. 5, 2019

(65) Prior Publication Data
US 2021/0241953 A1    Aug. 5, 2021

(51) Int. Cl.
*H01F 6/04* (2006.01)
*H01F 6/06* (2006.01)

(52) U.S. Cl.
CPC ........ *H01F 6/04* (2013.01); *H01F 6/06* (2013.01)

(58) Field of Classification Search
CPC ............... H01F 6/04; H01F 6/06; H01L 39/04
See application file for complete search history.

(56) References Cited

U.S. PATENT DOCUMENTS

2016/0233011 A1* 8/2016 Eguchi .................. H01F 6/06
2017/0200541 A1* 7/2017 Inoue ................... H01F 6/02

FOREIGN PATENT DOCUMENTS

| DE | 4223145 A1 * | 1/1994 | ............... F25D 3/10 |
| JP | H0774019 A | 3/1995 | |
| WO | WO-2016035153 A1 * | 3/2016 | ............... H01F 6/04 |

OTHER PUBLICATIONS

IP.com Search Results.*
Global Dossier.*
International Search Report (PCT/ISA/210) dated Aug. 28, 2018, by the Japan Patent Office as the International Searching Authority for International Application No. PCT/JP2018/020931.
Written Opinion (PCT/ISA/237) dated Aug. 28, 2018, by the Japan Patent Office as the International Searching Authority for International Application No. PCT/JP2018/020931.

* cited by examiner

*Primary Examiner* — Mohamad A Musleh
(74) *Attorney, Agent, or Firm* — Buchanan Ingersoll & Rooney PC

(57) ABSTRACT

A superconducting magnet includes a superconducting coil, a coolant container, a radiation shield, a vacuum container, a first pipe, a refrigerator, a separator, a second pipe, a third pipe, a fourth pipe, and at least one pressure relief valve. The refrigerator is disposed such that a first flow path of vaporized coolant is defined by the refrigerator and the first pipe. The third pipe is connected to the first pipe outside the vacuum container, and extends in contact with the vacuum container. The fourth pipe is connected to the second pipe outside the vacuum container, and extends in contact with the vacuum container. The pressure relief valve is connected to the third pipe and the fourth pipe.

4 Claims, 1 Drawing Sheet

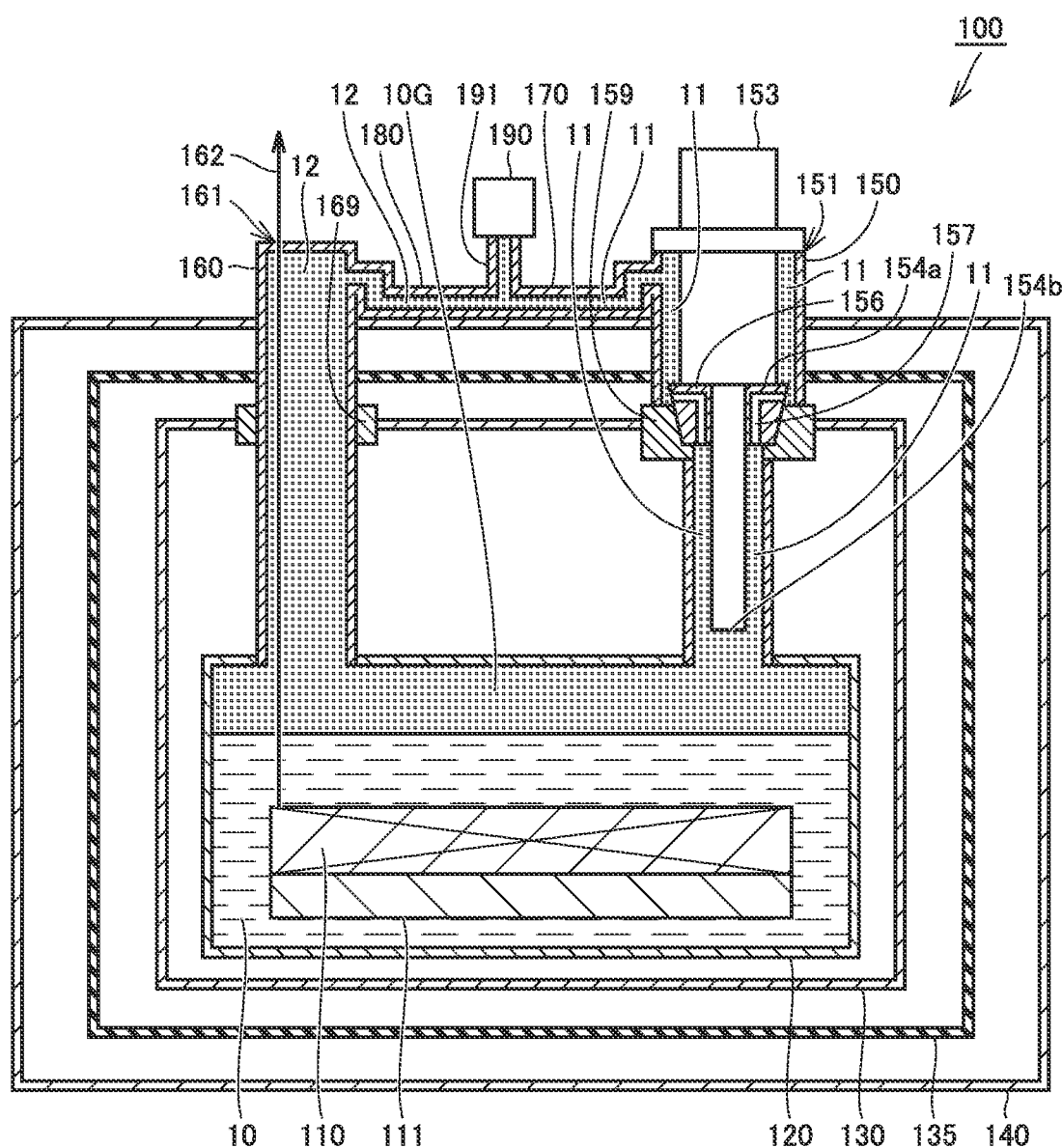

SUPERCONDUCTING MAGNET

TECHNICAL FIELD

The present invention relates to a superconducting magnet.

BACKGROUND ART

A prior literature, Japanese Patent Laying-Open No. 7-74019 (PTL 1), discloses a superconducting magnet including a refrigerator. The superconducting magnet described in PTL 1 includes a superconducting coil, an inner container, a radiation shield, an outer container, a coolant-gas liquefying refrigerator, an external connection port, a shield pipe, and a valve.

The superconducting coil is contained in the inner container. The inner container is a coolant container filled with liquid coolant. The radiation shield surrounds the inner container. The outer container is a vacuum container covering the outer periphery of the radiation shield. The coolant-gas liquefying refrigerator is integrated into the outer container. To the external connection port, a liquid injection pipe and a gas recovery pipe are connected. The shield pipe is attached to the radiation shield along the radiation shield. The valve allows the coolant gas to be released from the shield pipe to the outside.

CITATION LIST

Patent Literature

PTL 1: Japanese Patent Laying-Open No. 7-74019

SUMMARY OF INVENTION

Technical Problem

In a superconducting magnet, when no electric power is supplied, e.g., during a power breakdown or transportation, the coolant in the coolant container is vaporized by the heat intruding through the external connection port and through the coolant-gas liquefying refrigerator. When the vaporized coolant is released to the outside through the pipe, the pipe is cooled by the sensible heat of the vaporized coolant.

The amount of heat intrusion differs between the heat intrusion path from the external connection port and the heat intrusion path from the coolant-gas liquefying refrigerator. Accordingly, in order to effectively suppress the heat intrusion from outside into the coolant container, the cooling via vaporized coolant should be performed differently depending on the amount of heat intrusion, between the heat intrusion path having a large amount of heat intrusion and the heat intrusion path having a small amount of heat intrusion.

The present invention has been made in view of such a problem. An object of the present invention is to provide a superconducting magnet that can effectively suppress the heat intrusion from outside into a coolant container even when electric power supply is stopped.

Solution to Problem

A superconducting magnet according to the present invention includes a superconducting coil, a coolant container, a radiation shield, a vacuum container, a first pipe, a refrigerator, a separator, a second pipe, a third pipe, a fourth pipe, and at least one pressure relief valve. The coolant container contains the superconducting coil in a state where the superconducting coil is immersed in liquid coolant. The radiation shield surrounds the coolant container. The vacuum container contains the superconducting coil, the coolant container, and the radiation shield. The first pipe passes through the vacuum container and the radiation shield and is connected to the coolant container, the first pipe including a mounting opening outside the vacuum container. The refrigerator is inserted in the first pipe through the mounting opening and fixed so as to seal the mounting opening, with a first flow path of the vaporized coolant being defined by the refrigerator and the first pipe. The separator is disposed in a gap between the inner face of the first pipe and the refrigerator. The separator separates the interior of the first pipe into a part on the coolant container side and a part on the mounting opening side, and defines a part of the first flow path. The second pipe passes through the vacuum container and the radiation shield and is connected to the coolant container, the second pipe defining a second flow path of the vaporized coolant. The third pipe is connected to the first pipe outside the vacuum container, and extends in contact with the vacuum container. The fourth pipe is connected to the second pipe outside the vacuum container, and extends in contact with the vacuum container. The pressure relief valve is connected to the third pipe and the fourth pipe.

Advantageous Effects of Invention

The present invention enables adjustment of the flow rate of vaporized coolant in each of the first flow path and the second flow path, thereby allowing the vaporized coolant to flow at a flow rate in accordance with the amount of heat intrusion. Thus, even when electric power supply is stopped, the vacuum container and the radiation shield can be effectively cooled, with effective suppression of the heat intrusion from outside into the coolant container.

BRIEF DESCRIPTION OF DRAWINGS

FIG. 1 is a cross-sectional view showing a structure of a superconducting magnet according to one embodiment of the present invention.

DESCRIPTION OF EMBODIMENTS

A superconducting magnet according to one embodiment of the present invention will now be described with reference to the drawing. In the description of the embodiment below, identical or corresponding parts are identically denoted in the FIGURE, and the description thereof is not repeated.

Although the embodiment below describes a hollow cylindrical superconducting magnet, the present invention is not necessarily limited to a hollow cylindrical superconducting magnet but may also be applied to an open superconducting magnet.

FIG. 1 is a cross-sectional view showing a structure of a superconducting magnet according to one embodiment of the present invention. FIG. 1 shows a cross section of only the upper part of the superconducting magnet. As shown in FIG. 1, a superconducting magnet 100 according to one embodiment of the present invention includes a superconducting coil 110, a coolant container 120, a radiation shield 130, a vacuum container 140, a first pipe 150, a refrigerator 153, a separator 156, a second pipe 160, a third pipe 170, a fourth pipe 180, and at least one pressure relief valve 190.

Superconducting coil 110 is formed, for example, by winding a superconducting wire made of a copper matrix with a niobium-titanium alloy embedded in its center part. Superconducting coil 110 is wound around a reel 111 made of a non-magnetic material, such as stainless-steel or aluminum.

Coolant container 120 contains superconducting coil 110 and reel 111 in a state where superconducting coil 110 and reel 111 are immersed in liquid coolant 10. Coolant container 120 has a hollow cylindrical shape, which is substantially similar to superconducting coil 110 in outer shape. Coolant container 120 is made of a non-magnetic material, such as stainless-steel or aluminum.

In coolant container 120, reel 111 is supported on a support (not shown) and fixed in coolant container 120, with a gap between reel 111 and coolant container 120. Superconducting coil 110 may be wound around the bottom of coolant container 120, in which case no reel 111 is provided.

Liquid coolant 10 is liquid helium in the present embodiment. However, liquid coolant 10 may be any other coolant that can bring superconducting coil 110 into a superconducting state, e.g., liquid nitrogen.

Radiation shield 130 surrounds coolant container 120. Radiation shield 130 has a hollow cylindrical shape, which is substantially similar to coolant container 120 in shape. Radiation shield 130 thermally insulates coolant container 120 from vacuum container 140 (described later). Radiation shield 130 is made of, for example, a non-magnetic material having a high light reflectance, such as aluminum.

Superconducting magnet 100 according to the present embodiment further includes a multi-layer heat insulator 135 (superinsulation) between radiation shield 130 and vacuum container 140 (described later). Multi-layer heat insulator 135 covers the outer side of radiation shield 130. Multi-layer heat insulator 135 may be attached to the surface of radiation shield 130.

Vacuum container 140 contains superconducting coil 110, coolant container 120, and radiation shield 130. Vacuum container 140 has a hollow cylindrical shape, which is substantially similar to radiation shield 130 in shape.

Each of coolant container 120 and radiation shield 130 in vacuum container 140 is fixed to vacuum container 140 by a plurality of support rods (not shown). The support rods are made of, for example, glass epoxy. The interior of vacuum container 140 is reduced in pressure by a pressure reducing device (not shown) to form a vacuum.

Vacuum container 140 is made of, for example, a non-magnetic material, such as stainless-steel or aluminum, for vacuum insulation between the inner and outer sides of vacuum container 140.

First pipe 150 passes through vacuum container 140 and radiation shield 130 and is connected to coolant container 120. First pipe 150 is made of a non-magnetic material, such as stainless-steel. First pipe 150 includes a mounting opening 151 outside vacuum container 140.

Refrigerator 153 is inserted in first pipe 150 through mounting opening 151 and fixed so as to seal mounting opening 151. For example, an O-ring (not shown) is used for tight sealing, so that a gap may not be created between the upper face of mounting opening 151 of first pipe 150 and the lower face of a flange of refrigerator 153 in a state where refrigerator 153 is disposed through mounting opening 151.

Refrigerator 153 cools the interior of coolant container 120 and liquefies vaporized coolant 10G. In the present embodiment, refrigerator 153 is a non-removable fixed-type refrigerator. Refrigerator 153 may be a Gifford-McMahon refrigerator or a pulse tube refrigerator each having two refrigeration stages.

In the present embodiment, refrigerator 153 includes a first refrigeration stage 154a and a second refrigeration stage 154b. First refrigeration stage 154a is in contact with separator 156 (described later) in refrigerator 153. First refrigeration stage 154a is connected to an edge of radiation shield 130, with separator 156 and a first heat transfer portion 159 (described later) interposed therebetween. During the operation of refrigerator 153, first refrigeration stage 154a cools not only the interior of first pipe 150 but also radiation shield 130.

Second refrigeration stage 154b of refrigerator 153 is located above the portion where coolant container 120 is connected to first pipe 150, and below the first refrigeration stage. During the operation of refrigerator 153, second refrigeration stage 154b re-liquefies vaporized coolant 10G.

Refrigerator 153 is disposed such that a first flow path 11 of vaporized coolant 10G is defined by refrigerator 153 and first pipe 150. While refrigerator 153 is stopped, heat is exchanged between refrigerator 153 and coolant 10G flowing through first flow path 11, thereby cooling refrigerator 153. This can suppress the heat intrusion through stopped refrigerator 153 into coolant container 120.

Separator 156 is located in the gap between the inner face of first pipe 150 and refrigerator 153. Separator 156 separates the interior of first pipe 150 into a part on the coolant container 120 side and a part on the mounting opening 151 side. Also, separator 156 defines a part of first flow path 11. Separator 156 separating the interior of first pipe 150 allows the interior of coolant container 120 to be efficiently cooled during the operation of refrigerator 153.

Separator 156 extends in the circumferential direction relative to the central axis of first pipe 150 and surrounds refrigerator 153 in first pipe 150. Separator 156 has a plurality of holes 157 that serve as a part of first flow path 11. The plurality of holes 157 are spaced from each other in the circumferential direction in separator 156 and allow communication between the part on the coolant container 120 side and the part on the mounting opening 151 side in first pipe 150.

The plurality of holes 157 arranged in this manner allow vaporized coolant 10G to flow therethrough, thereby enabling efficient heat exchange between stopped refrigerator 153 and vaporized coolant 10G via separator 156. The plurality of holes 157 are preferably equally spaced in the circumferential direction of separator 156.

Separator 156 faces an edge of radiation shield 130, with first pipe 150 being interposed therebetween. Separator 156, located at this position, allows radiation shield 130 to be cooled via first pipe 150 by the sensible heat of vaporized coolant 10G flowing through separator 156 when refrigerator 153 is stopped. This in turn can effectively suppress the heat intrusion from outside into coolant container 120 when electric power supply is stopped.

Separator 156 is preferably made of a highly thermally conductive material. Separator 156 is made of, for example, copper.

Superconducting magnet 100 according to the present embodiment further includes a ring-shaped first heat transfer portion 159. In the present embodiment, first heat transfer portion 159 constitutes a part of the peripheral wall of first pipe 150. However, first heat transfer portion 159 may be in contact with the outer periphery of the peripheral wall of first pipe 150.

In the present embodiment, first heat transfer portion 159 is in contact with separator 156. Specifically, first heat transfer portion 159 is in contact with the outer periphery of separator 156 such that first heat transfer portion 159 does not cover holes 157. In the case where first heat transfer portion 159 is in contact with the outer periphery of the peripheral wall of first pipe 150, first heat transfer portion 159 is indirectly connected to separator 156, with the peripheral wall of first pipe 150 being interposed therebetween.

First heat transfer portion 159 is located between separator 156 and an edge of radiation shield 130. With this construction, when refrigerator 153 is stopped, the sensible heat of vaporized coolant 10G flowing through separator 156 can cool radiation shield 130 via first heat transfer portion 159 with enhanced efficiency. Further, separator 156 being in contact with the first refrigeration stage of refrigerator 153 achieves enhanced efficiency in cooling radiation shield 130 during the operation of superconducting magnet 100.

First heat transfer portion 159 is preferably made of a highly thermally conductive material. First heat transfer portion 159 is made of, for example, copper.

Second pipe 160 passes through vacuum container 140 and radiation shield 130 and is connected to coolant container 120. Second pipe 160 defines a second flow path 12 of vaporized coolant 10G. Second pipe 160 is made of a non-magnetic material, such as stainless-steel. In the present embodiment, second pipe 160 includes a lead-out opening 161 outside vacuum container 140.

Superconducting magnet 100 according to the present embodiment further includes a current lead 162 electrically connected to superconducting coil 110. Current lead 162 is led out through the inside of second pipe 160 and lead-out opening 161 to the outside in an airtight fashion. The tip of current lead 162 led out to the outside is connected to an electric power supply (not shown).

Current lead 162 in the present embodiment is a non-removable fixed-type current lead. The material of current lead 162 contains phosphorous-deoxidized copper as a major component. The major component of the material of current lead 162, however, is not limited to phosphorous-deoxidized copper but may also be, for example, brass or electrolytic copper.

Superconducting magnet 100 according to the present embodiment further includes a ring-shaped second heat transfer portion 169. In the present embodiment, second heat transfer portion 169 is in contact with the outer periphery of the peripheral wall of second pipe 160. However, second heat transfer portion 169 may constitute a part of the peripheral wall of second pipe 160.

Second heat transfer portion 169 is located between second pipe 160 and an edge of the radiation shield. With this construction, when refrigerator 153 is stopped, the sensible heat of vaporized coolant 10G flowing through second flow path 12 can cool radiation shield 130 via second heat transfer portion 169 with enhanced efficiency.

Second heat transfer portion 169 is preferably made of a highly thermally conductive material. Second heat transfer portion 169 is made of, for example, copper.

Third pipe 170 is connected to first pipe 150 outside vacuum container 140. Third pipe 170 extends in contact with vacuum container 140. Third pipe 170 defines another part of first flow path 11 of vaporized coolant 10G. The sensible heat of vaporized coolant 10G can cool vacuum container 140 in contact with third pipe 170, thereby suppressing the heat intrusion from outside with enhanced effectiveness.

Third pipe 170 is made of a non-magnetic material, such as copper.

Fourth pipe 180 is connected to second pipe 160 outside vacuum container 140.

Fourth pipe 180 extends in contact with vacuum container 140. Fourth pipe 180 defines another part of second flow path 12 of vaporized coolant 10G. The sensible heat of vaporized coolant 10G can cool vacuum container 140 in contact with fourth pipe 180, thereby suppressing the heat intrusion from outside with enhanced effectiveness.

Fourth pipe 180 is made of a non-magnetic material, such as copper.

The inner diameters and lengths of third pipe 170 and fourth pipe 180 are determined in accordance with the amounts of heat intrusion through first pipe 150 and second pipe 160 at the time when electric power supply is stopped. Specifically, the inner diameters and lengths of third pipe 170 and fourth pipe 180 are determined such that the flow rate of vaporized coolant 10G flowing through first flow path 11 is higher than the flow rate of vaporized coolant 10G flowing through second flow path 12, since the amount of heat intrusion through first pipe 150 is larger than through second pipe 160.

That is, third pipe 170 and fourth pipe 180 are configured such that the flow rate of vaporized coolant 10G flowing through first flow path 11 is higher than the flow rate of vaporized coolant 10G flowing through second flow path 12.

Pressure relief valve 190 is connected to third pipe 170 and fourth pipe 180. Vaporized coolant 10G flows through first flow path 11 in third pipe 170 and second flow path 12 in fourth pipe 180, and is then released from pressure relief valve 190.

In the present embodiment, third pipe 170 and fourth pipe 180 are connected to one common pressure relief valve 190. Specifically, third pipe 170 and fourth pipe 180 are connected to a connection pipe 191 which is connected to one pressure relief valve 190. Third pipe 170 and fourth pipe 180 may be connected to two different pressure relief valves 190, respectively.

As described above, first flow path 11 extends from coolant container 120 through first pipe 150 and third pipe 170 to pressure relief valve 190. Second flow path 12 extends from coolant container 120 through second pipe 160 and fourth pipe 180 to pressure relief valve 190.

As described above, in superconducting magnet 100 according to one embodiment of the present invention, each of third pipe 170 and fourth pipe 180 extends in contact with vacuum container 140. This construction enables adjustment of the flow rate of vaporized coolant 10G in each of first flow path 11 and second flow path 12 in accordance with the amount of heat intrusion. Thus, even when electric power supply is stopped, vacuum container 140 and radiation shield 130 can be efficiently cooled, with effective suppression of the heat intrusion from outside into coolant container 120.

Further, separator 156 extends in the circumferential direction relative to the central axis of first pipe 150 and surrounds refrigerator 153 in first pipe 150. Separator 156 has a plurality of holes 157 spaced from each other in the circumferential direction. Holes 157 allow communication between the part on the coolant container 120 side and the part on the mounting opening 151 side, thereby serving as a part of first flow path 11. Thus, vaporized coolant 10G flowing through the plurality of holes 157 can more evenly cool separator 156, thereby effectively suppressing the heat intrusion into coolant container 120.

Third pipe 170 and fourth pipe 180 are connected to one common pressure relief valve 190. Third pipe 170 and fourth pipe 180 are configured such that the flow rate of vaporized coolant 10G flowing through first flow path 11 is higher than the flow rate of vaporized coolant 10G flowing through second flow path 12. This construction allows first pipe 150 and second pipe 160 to be cooled in accordance with the amount of heat intrusion, without the need of a mechanism such as a flow rate control valve. This can effectively suppress the heat intrusion from outside the superconducting magnet 100 into coolant container 120, even when electric power supply is stopped.

The present invention is not limited to the above-described embodiment. Third pipe 170 and fourth pipe 180 may have the same inner diameter and the same length, and first flow path 11 in first pipe 150 and second flow path 12 in second pipe 160 may have areas in accordance with the amounts of heat intrusion through first pipe 150 and through second pipe 160, respectively.

The embodiments disclosed herein are illustrative in every respect, and do not serve as a basis for limitative interpretation. Therefore, the technical scope of the present invention should not be interpreted only based on the embodiments described above, but is defined based on the terms of the claims. Further, the technical scope of the present invention includes any modification within the meaning and scope equivalent to the terms of the claims.

REFERENCE SIGNS LIST 10, 10G: coolant; 11: first flow path; 12: second flow path; 100: superconducting magnet; 110: superconducting coil; 111: reel; 120: coolant container; 130: radiation shield; 135: multi-layer heat insulator; 140: vacuum container; 150: first pipe; 151: mounting opening; 153: refrigerator; 154a: first refrigeration stage; 154b: second refrigeration stage; 156: separator; 157: hole; 159: first heat transfer portion; 160: second pipe; 161: lead-out opening; 162: current lead; 169: second heat transfer portion; 170: third pipe; 180: fourth pipe; 190: pressure relief valve; 191: connection pipe

The invention claimed is:

1. A superconducting magnet comprising:
    a superconducting coil;
    a coolant container containing the superconducting coil in a state where the superconducting coil is immersed in liquid coolant;
    a radiation shield surrounding the coolant container;
    a vacuum container containing the superconducting coil, the coolant container, and the radiation shield;
    a first pipe passing through the vacuum container and the radiation shield and connected to the coolant container, the first pipe including a mounting opening outside the vacuum container;
    a refrigerator inserted in the first pipe through the mounting opening and fixed so as to seal the mounting opening, with a first flow path of the coolant vaporized being defined by the refrigerator and the first pipe;
    a separator disposed in a gap between an inner face of the first pipe and the refrigerator, the separator separating an interior of the first pipe into a part on a coolant container side and a part on a mounting opening side, the separator defining a part of the first flow path;
    a second pipe passing through the vacuum container and the radiation shield and connected to the coolant container, the second pipe defining a second flow path of the coolant vaporized;
    a third pipe connected to the first pipe outside the vacuum container, the third pipe extending in contact with the vacuum container;
    a fourth pipe connected to the second pipe outside the vacuum container, the fourth pipe extending in contact with the vacuum container; and
    at least one pressure relief valve connected to the third pipe and the fourth pipe.

2. The superconducting magnet according to claim 1, wherein
    the separator extends in a circumferential direction relative to a central axis of the first pipe and surrounds the refrigerator in the first pipe, and
    the separator has a plurality of holes spaced from each other in the circumferential direction, the plurality of holes allowing communication between the part on the coolant container side and the part on the mounting opening side, the plurality of holes serving as the part of the first flow path.

3. The superconducting magnet according to claim 1, wherein
    the at least one pressure relief valve connected to the third pipe and the fourth pipe is one common pressure relief valve, and
    the third pipe and the fourth pipe are configured such that a flow rate of the coolant vaporized flowing through the first flow path is higher than a flow rate of the coolant vaporized flowing through the second flow path.

4. The superconducting magnet according to claim 2, wherein
    the at least one pressure relief valve connected to the third pipe and the fourth pipe is one common pressure relief valve, and
    the third pipe and the fourth pipe are configured such that a flow rate of the coolant vaporized flowing through the first flow path is higher than a flow rate of the coolant vaporized flowing through the second flow path.

* * * * *